(12) United States Patent
Quenzer et al.

(10) Patent No.: US 7,364,930 B2
(45) Date of Patent: Apr. 29, 2008

(54) METHOD FOR PRODUCING MICROMECHANICAL AND MICRO-OPTIC COMPONENTS CONSISTING OF GLASS-TYPE MATERIALS

(75) Inventors: Hans-Joachim Quenzer, Itzehoe (DE); Peter Merz, Hanerau-Hademarschen (DE); Arne Veit Schulz, Hamburg (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 337 days.

(21) Appl. No.: 11/172,892

(22) Filed: Jul. 5, 2005

(65) Prior Publication Data

US 2005/0239228 A1  Oct. 27, 2005

Related U.S. Application Data

(62) Division of application No. 09/889,956, filed as application No. PCT/EP00/11688 on Nov. 23, 2000, now Pat. No. 6,951,119.

(30) Foreign Application Priority Data

Nov. 25, 1999  (DE) ................. 199 56 654

(51) Int. Cl.
*H01L 21/00* (2006.01)
(52) U.S. Cl. ............................ 438/48; 438/29; 438/33; 257/E21.53; 257/E21.527; 257/E31.127
(58) Field of Classification Search ............. 438/29–48
See application file for complete search history.

(56) References Cited

U.S. PATENT DOCUMENTS 3,221,654 A  12/1965  Jernt
(Continued)

FOREIGN PATENT DOCUMENTS

DE  1 596 490  5/1971
(Continued)

OTHER PUBLICATIONS

Jens Schulze et al., "Compact self-aligning assemblies with refractive microlens arrays made by contactless embossing", Proceedings of the SPIE Jan. 29-30, 1998, vol. 3289, pp. 22-32, SPIE-Int. Soc. Opt. Eng, USA, 1998.

(Continued)

*Primary Examiner*—Walter Lindsay, Jr.
*Assistant Examiner*—Abdulfattah Mustapha
(74) *Attorney, Agent, or Firm*—Buchanan Ingersoll & Rooney PC

(57) ABSTRACT

What is proposed here is a method of structuring surfaces of glass-type materials and variants of this method, comprising the following steps of operation: providing a semiconductor substrate, structuring, with the formation of recesses, of at least one surface of the semiconductor substrate, providing a substrate of glass-type material, joining the semiconductor substrate to the glass-type substrate, with a structured surface of the semiconductor substrate being joined to a surface of the glass-type surface in an at least partly overlapping relationship, and heating the substrates so bonded by annealing in a way so as to induce an inflow of the glass-type material into the recesses of the structured surface of the semiconductor substrate. The variants of the method are particularly well suitable for the manufacture of micro-optical lenses and micro-mechanical components such as micro-relays or micro-valves.

17 Claims, 6 Drawing Sheets

U.S. PATENT DOCUMENTS

Figure 1:
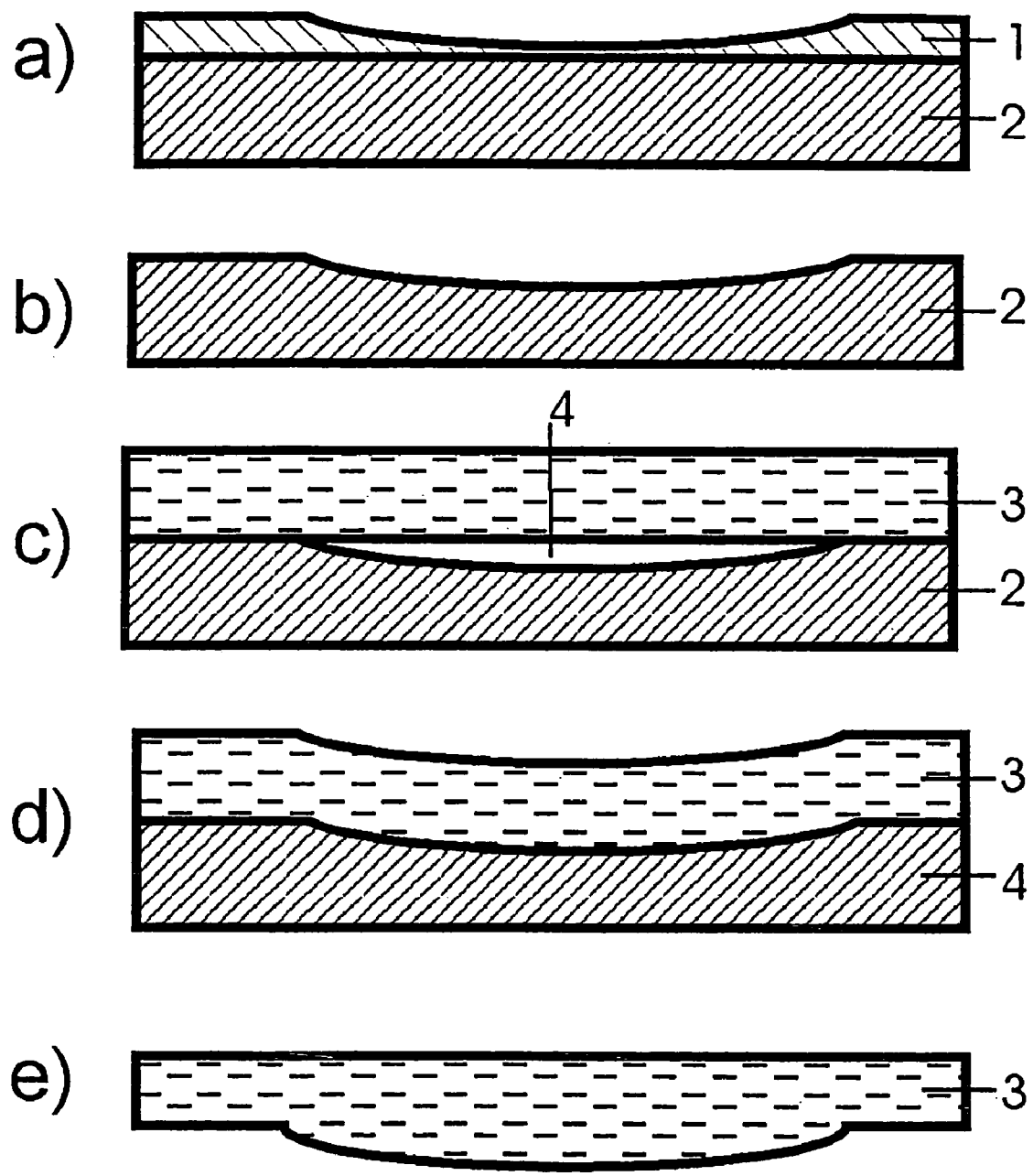

| | | | |
|---|---|---|---|
| 3,961,929 A | 6/1976 | Stockdale | |
| 4,867,371 A | 9/1989 | Davis | |
| 4,883,524 A | 11/1989 | Bristol | |
| 4,883,525 A | 11/1989 | Buckley et al. | |
| 4,902,641 A * | 2/1990 | Koury, Jr. | 438/151 |
| 5,122,176 A | 6/1992 | Goettler | |
| 5,310,623 A | 5/1994 | Gal | |
| 5,623,368 A | 4/1997 | Calderini et al. | |
| 5,876,642 A | 3/1999 | Calderini et al. | |
| 6,256,149 B1 | 7/2001 | Rolfe | |
| 6,305,194 B1 * | 10/2001 | Budinski et al. | 65/105 |
| 6,334,973 B1 | 1/2002 | Fukazaki et al. | |
| 6,361,718 B1 | 3/2002 | Shinmo et al. | |
| 6,385,997 B1 | 5/2002 | Nelson et al. | |
| 6,415,093 B1 | 7/2002 | Nakamura et al. | |
| 2002/0145807 A1 | 10/2002 | Nishikawa | |
| 2003/0011889 A1 | 1/2003 | Harden et al. | |
| 2003/0115907 A1 | 6/2003 | Patton et al. | |

FOREIGN PATENT DOCUMENTS

| | | |
|---|---|---|
| EP | 0 493 202 | 7/1992 |
| EP | 0 567 896 | 11/1993 |
| EP | 0 690 028 | 1/1996 |
| WO | 97/19027 | 5/1997 |

OTHER PUBLICATIONS

Dong Quin et al., "Microfabrication, Microstructures and Microsystems", Topics in Current Chemistry, vol. 194, Microsystem Technology in Chemistry and Life Sciences, Springer Verlag, Berlin Heidelberg 1998, pp. 1-20.

Thierry Corman et al., "Low-Pressure Encapsulated Resonant Structures with Integrated Electrodes for Electrostatic Excitation and Capacitive Detection", Sensors and Actuators A 66, 1998, pp. 160-166.

* cited by examiner b)

3 c)

2 d)

3

METHOD FOR PRODUCING MICROMECHANICAL AND MICRO-OPTIC COMPONENTS CONSISTING OF GLASS-TYPE MATERIALS

CROSS-REFERENCE TO RELATED APPLICATIONS

This application is a divisional of U.S. application Ser. No. 09/889,956 entitled METHOD FOR PRODUCING MICROMECHANICAL AND MICRO-OPTIC COMPONENTS CONSISTING OF GLASS-TYPE MATERIALS, filed Oct. 30, 2001 now U.S. Pat. No. 6,951,119, which is a 371 of International Application No. PCT/EP00/11688, filed Nov. 23, 2000, and claims priority under 35 U.S.C. § 119 to German Application No. 199 56 654.2, filed Nov. 25, 1999, the entire content of each of which is hereby incorporated by reference.

The present invention relates to a method of producing micro-mechanical and micro-optic components and/or functional elements consisting of glass-type materials, which permits the duplication modelling of structured substrate surfaces in glass, with utilisation of the flow properties of the glass and with application of standard methods in semiconductor technology. The term "functional element" is meant to denote a substrate with a structured surface in accordance with the present invention, which consists of glass-type material and is used in further-going steps of method.

Shaping methods, e.g. in mono-crystalline silicon, are widely common as standard methods in semiconductor technology. For transmissive micro-optical components such as lenses, optical gratings or beam shapers, however, semiconductor materials are suitable only conditionally. Silicon, for instance, presents a strong absorption in the visible range of wavelengths of the light. Optical components for wavelengths between 380 nm and 760 nm are thus made of materials similar to glass. The numerous expedient material properties of glass—such as a low coefficient of thermal expansion or a high mechanical and chemical stability—are also expediently employed in micro-mechanical components. The production of such components is limited, however, insofar as suitable methods are available only conditionally with respect to the micro-structuring of glass-type materials. In particular, the standard methods known from semiconductor technology are ruled out because suitable etching processes for achieving comparable structure levels are not known for glass-type materials.

PRIOR ART

For the production of micro-optical as well as micro-mechanical components mechanical operations such as grinding, sawing, polishing and scribing are applied in accordance with prior art (e.g. echelette grating). As a result, however, both the precision and the variation of shapes are strongly restricted. The hot relief printing of glass, which is employed for the mass production of macroscopic objects, is not appropriate for the production of micro-optical or micro-mechanical components in the order of less than one millimetre because of the lack of suitable materials for the production of the relief printing matrices and as the detachment of the glass from the relief printing matrices results in poor surface qualities. One method of producing micro-optical systems is based on the production of three-dimensional structures in resist layers by means of grey-tint lithography and the subsequent transfer of the structure into the glass substrate underneath by application of an RIE plasma process (U.S. Pat. No. 5,310,623).

Another method of producing micro lenses as well as micro-lens arrays makes use of resist arrays caused to fuse and thus forming lens-shaped topographies that are subsequently transferred into the substrate underneath by means of an etching process. In terms of the component height, both methods are restricted to a few tens of micrometers and therefore they are also limited in terms of their lateral dimension. Apart therefrom, the etching process increases the surface roughness.

BRIEF DESCRIPTION OF THE INVENTION

The present invention is based on the problem of providing methods of structuring surfaces of micro-mechanical and/or micro-optical components and/or functional elements consisting or glass or glass-type materials, which permit the precise and low-cost shaping of the elements down to the sub-µm range, whilst the height of the elements may amount to a few hundreds of micrometers, as well as providing the elements produced by this method.

In accordance with the present invention, this problem is solved by the features of methods described herein. A component or functional element produced by the methods is described herein.

The preferred embodiments are described herein.

The inventive method operates on standard lithographic and etching processes for the production of negative moulds (master structures) from a substrate, preferably a semiconductor substrate, e.g. of silicon.

In the following, the term "semiconductor substrate" will be used, however with out any restriction of the general applicability. Due to the combination of standard bonding techniques, preferably anodic bonding with a flow process at elevated temperature, the master structures are transferred into glass or glass-like materials. The negative moulds present a surface structure laterally reversed to the desired surface structure of the glass material, which means that at locations where recesses are present on the surface of the semiconductor substrate projections are created in the glass material on the surface facing the semiconductor substrate. The negative moulds are preferably produced from mono-crystalline silicon. To this end, a large number of possibilities is available for processing on almost any surface structure whatsoever, due to the combination of lithographic processes with wet chemical isotropic as well as anisotropic etching methods and various dry etching processes.

In a similar manner, it is possible to create optical lenses with an extremely low surface roughness and in a size smaller than one millimetre. At lower temperatures or shorter annealing intervals, the glass-type material slowly lowers into the cavities on the substrate, forming there defined lens-shaped surfaces. The cavities may be interconnected by channel systems so as to ensure the same process pressure at any location. The lowering depth, which determines the focal length of a lens so produces, may be precisely adjusted by setting the temperature, the pressure and the annealing interval. A subsequent polishing step equalises the dents forming on the face turned away from the substrate so that after removal of the substrate by etching micro lenses and micro-lens arrays are present on the glass in any variation in shape whatsoever. Generally, borosilicate glass, such as Pyrex® glass, is used for the process as this type of glass displays a small thermal expansion characteristic in correspondence with the thermal expansion of silicon. The bond established between the glass and the semiconductor substrate them remains particularly stable during the annealing operation. By the term "glass-type" material, however, any material is to be understood that presents the expedient material properties of glass at least in parts, and that presents viscous flow properties under the influence of an elevated temperature and/or the action of a pressure difference, e.g. glass-ceramics.

The inventive method consists of the follow process flow:

Conventional lithographic processes are employed to transfer digital or continuous structures into a photo sensitive resist that is applied on a semiconductor substrate, preferably a mono-crystalline silicon wafer. Standard methods are available for transferring digital structures, which are the common contact or projection exposure processes usually employed in the semiconductor industry. When grey-tint lithography is applied it is possible to structure surfaces of almost any shape whatsoever. After exposure, the resist volume that was not exposed is removed in a developer bath.

With application of etching processes, the topography of the resist layer is transferred to the semiconductor substrate. This may be done by both wet chemical etching processes (e.g. etching in baths containing hydrogen-fluorine compounds) and dry etching methods (plasma etching, reactive ion etching).

The structured semiconductor substrate is bonded to a substrate consisting of a glass-type material (glass substrate), e.g. a Pyrex® wafer, preferably by means of the anodic bonding technique, so that a hermetically tight bond will be created between the semiconductor substrate and the glass substrate. This is done under conditions resembling those of a vacuum, e.g. by negative pressure. After bonding, the pressure prevailing throughout the bonding operation in the process chamber, is preserved in the recesses of the surface structure of the semiconductor substrate. With the anodic bonding technique, two extremely planar substrates are heated on a so-called hot plate, which is a conductive substrate (e.g. a semiconductor substrate) and a non-conductive substrate (e.g. a glass substrate). Additionally, a voltage of up to 1,000 Volt is applied between the substrates. When the negative pole is present on the glass substrate the positive mobile ions (e.g. sodium, potassium, boron, sulphur) present in the glass matrix migrate in a direction towards the cathode. The immobile stationary oxygen ions form a negative volume charge zone on the boundary to the semiconductor substrate. The resulting electrostatic force results in an intimate contact between the two adjacent substrate surfaces. In combination with the effects of an elevated temperature, this results in the formation of chemical bonds between the atoms of the conductor and non-conductor substrates. When additionally an outside pressing force is exerted on the substrates this results in an intensification of the bond.

By subsequent annealing, preferably at normal pressure, the glass material is heated to a level higher than the vitrifying temperature thereof. Due to its then plastic properties, the glass material fills the apertures in the structured surface of the semiconductor substrate. The annealing interval and the annealing temperature must be so high that with the given relative pressure conditions between the pressure of the atmosphere in the annealing furnace and the pressure preserved in the recesses of the semiconductor substrate surface during the bonding process, the glass material will flow into the recesses until a relief model of the semiconductor surface structure will be achieved. The propulsive force against the viscous resistance of the plastic glass material mass is the negative pressure prevailing in the apertures, relative to the atmosphere in the annealing furnace. With an identical temperature and process time, the material characteristics of the glass substrate will take the predominant influence on the relief formation and precision of the moulding operation. Particularly the precise composition of the glass, such as the quantity and type of the doping agent (e.g. boron, phosphorous) take an influence on the viscous properties of the glass. Moreover, the moulding characteristics are dependent on the quality of the vacuum during the anodic bonding process.

The flow of material may give rise to roughness on the glass substrate surface turned away from the semiconductor substrate. This roughness is created in particular when the glass substrate presents a small thickness relative to the structures on the semiconductor substrate that are to be moulded. The thicker the glass substrate, the smaller is the roughness crated on the glass substrate surface turned away from the semiconductor substrate. This roughness may be removed by grinding and/or polishing processes if they are undesirable. If a separation of the processed glass substrate from the semiconductor substrate is desired a standard etching process may be employed for separation of the processed glass substrate from the semiconductor substrate, wherein the silicon is completely removed by etching while the glass matrix is retained. To this end various chemicals such as tetra methyl ammonium hydroxide (TMAH) or xenon difluoride ($XeF_2$) are appropriate.

In a variant of the process it is possible to produce refractive lenses and lens arrays by partial inflow into a silicon structure. To this end, recesses are etched in the semiconductor wafer by a wet or dry chemical etching process, which are so dimensioned that after annealing the lens-forming bulges in the glass substrate will not contact the walls of the recesses. During the process, which is preferably carried out at normal pressure, of annealing the glass substrate bonded to the semiconductor substrate under vacuum or negative pressure, respectively, the glass substrate is heated to a level of 600 to 800 degrees Celsius. In distinction from the aforedescribed process, the sinking of the glass substrate into the prepared recesses of the semiconductor substrate is stopped by cooling when the desired degree of inflow, e.g. the desired lens shape, for example, is reached. Then, after cooling, the glass substrate side turned away from the semiconductor substrate, may be planished and the lenses may be exposed by removal of the semiconductor substrate by etching.

Another modification of the process is of interest particularly for structuring micro-mechanical components. This variant of the inventive method may be applied, for example, in the production of curved surfaces for the implementation of effective electrostatic actuators for low-voltage operation, such as those required for the design of micro-relays or micro valves. To this end the effect may be expediently utilised that very smooth and curved surface shapes are always formed when the glass material flows into the recesses of the semiconductor substrate on that glass substrate side that is turned away from the semiconductor substrate.

In a varied embodiment of the described method the glass substrate surface turned away from the semiconductor substrate is not planished after cooling but rather used for the production of the micro-mechanical components. The glass substrate surface, which was bonded to the semiconductor substrate, can be planished after removal of the semiconductor substrate by etching. For these applications the removal of the semiconductor substrate by etching is not definitely necessary. The further manufacturing steps of the micro-mechanical component(s) are then structured on the glass substrate surface turned away from the semiconductor substrate. In the case of an electrostatic actuator, initially the driving electrodes are produced in the curved pitches of the glass material. Subsequently, a thin layer is extended and structured over the pitches with these electrodes. This may be done, for example, by anodic bonding of a silicon wafer (e.g. SOI (silicon-on-isolator) wafer) on the glass surface, whereupon the wafer is ground and/or etched down to a thin layer.

The moulds produced in the aforedescribed manner in glass or glass-type materials may, in their turn, serve as functional elements and constitute a master structure for the production of printing and/or injection moulding moulds, e.g. nickel moulds for the injection moulding process. To this end it is preferred that the glass mould, which is produced by partial inflow of the glass material into the surface structure of the semiconductor substrate, is moulded in a metal, preferably a nickel alloy, in an electroplating process. The metal is here deposited from a solution on the surface to be relief moulded. After detachment of the glass mould and/or its removal by etching, the metal relief mould so produced constitutes the master mould for products presenting a surface structure and consisting of materials appropriate for such a use, e.g. a synthetic resin, which are to be manufactured in a printing and/or injection moulding operation.

The aforedescribed process variants are based on a selective local inflow of softened glass-type material into the recesses of the respective first substrate preferably consisting of a semiconductor material, e.g. a Si wafer. A third variant of the process for structuring surfaces of micro-mechanical and/or micro-optical components and/or functional elements of glass-type materials, by contrast, provides for joining the first substrate to the second substrate, at least in an overlapping relationship, in such a way that a medium, preferably a gaseous medium, will be introduced into the enclosed volume of the recesses, which medium undergoes expansion when heated, i.e. in the sub sequent annealing operation. This results in the consequence that the softened glass-type material is, so to speak, locally displaced in the zone of the recesses by the overpressure prevailing in the enclosed volume, so that dents of concave geometries will be formed in the surface of the second substrate, which is immediately opposite to the recesses, which are useful as optical dispersing lenses in one practical form of application.

In all the aforementioned process variants, it is important that the first substrate must be separated from the second substrate, if necessary, after termination of the shaping annealing step and cooling of the glass-type second substrate. It is possible on principle to subject the first substrate, which is mostly designed as semiconductor material, selectively to an etching process that separates, on the one hand, the first substrate from the second substrate and, on the other hand, destroys the first substrate in a non-recoverable manner. This is not particularly desirable, however, for reasons of costs.

When, by contrast, a parting layer is provided between the first and second substrates for maintaining the structure of the first substrate, the structured semiconductor substrate can also be used again undamaged in further subsequent shaping processes. The application of an appropriate parting layer is suitable to avoid that the first substrate, which is preferably designed as silicon wafer, must be destroyed in the final removal step.

To this end, several approaches are conceivable:

(a) A carbon layer (equally a diamond or diamond-type layer, SiC) is applied on the SI wafer to prevent adhesion of the glass-type material of the second substrate, which is preferably configured as glass wafer, to the silicon wafer. The bond between the Si wafer and the glass wafer is preferably achieved by a ring made of a solder material joining the two wafers to the wafer edge in a vacuum-tight manner. Even though the solder material becomes liquid at the process temperature during the annealing step, at which the glass flow takes place, the poor wetting of the uncoated glass or carbon layers prevents, however, an excessively deep penetration of the solder material between the wafers.

The separation of the two wafers can be performed either mechanically or the solder ring can be removed by etching while the carbon layer can be removed by an oxidation process (approximately 400 to 500° C. with oxygen supply).

Prior to a further use of the silicon wafer it may possibly be necessary to apply this parting layer again.

(b) An adhesion-enhancing layer of a suitable metal such as tantalum is applied on the Si wafer. A further metal, e.g. tin, is then applied on this layer. Tin equally prevents the glass from adhering to the silicon. The separation of the two wafers can be achieved by mechanical means by heating the tin, or by removal of the metal layer by etching it out.

(c) A second layer is applied on the silicon wafer, onto which the glass wafer may be provided directly by anodic bonding. Silicon or titanium could be quoted as examples of such a layer. This sacrificial layer is then removed by etching at the end of the complete process. In order to prevent any attack on the original silicon wafer the latter may be provided with appropriate layers such as silicon nitride or silicon carbide.

The relief moulding of structured substrate surfaces, e.g. silicon wafer surfaces, in glass is an important and promising method of manufacturing micro-optical components, for examples. Utilising the surface topography of a master structure, preferably consisting of silicon, which is produced with inclusion of the advantages of semiconductor technology, structures as small as down to the μm range are transferred to glass-type materials with a high precision. The expedient optical, mechanical and chemical properties such as those of glass can thus be made accessible to the high-precision moulding processes and the manifold potential structuring methods and processes common in semiconductor technology. Another advantage derives from the aspect that after the moulding of the glass the negative mould is removed by an etching process that does not involve a mechanical load on the glass material. This permits the realisation of very deep structures in the glass, which can never be achieved with printing on account of the mechanical load involved.

The method encompasses a combination of method steps that are applied in a particularly low-cost, efficient operation with a degree of purity and precision by parallel production (batch process) due to mass application in semiconductor technology. As a result, these advantages are transferred to the inventive method.

BRIEF DESCRIPTION OF THE INVENTION

Figure 2:
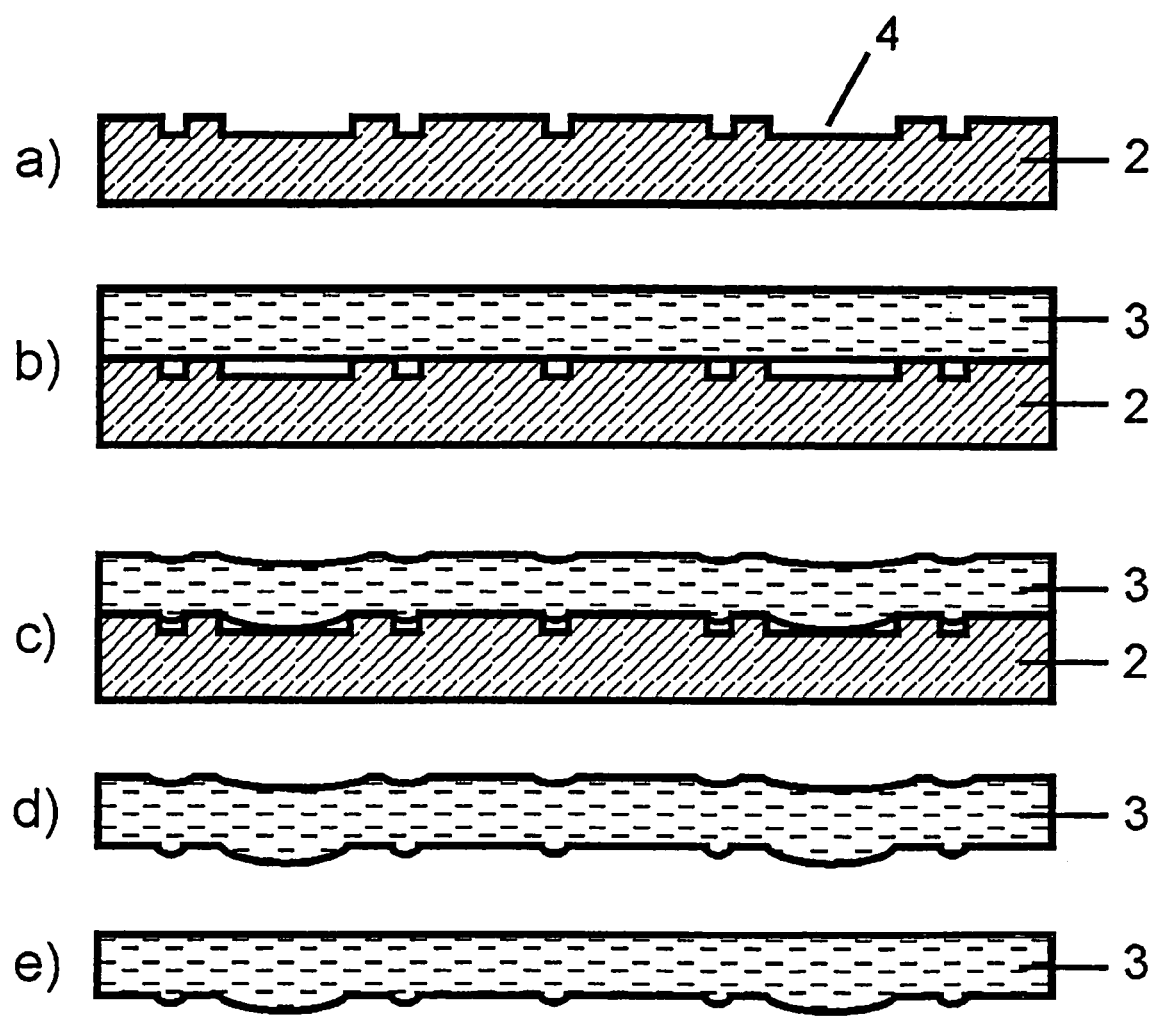
Figure 3:
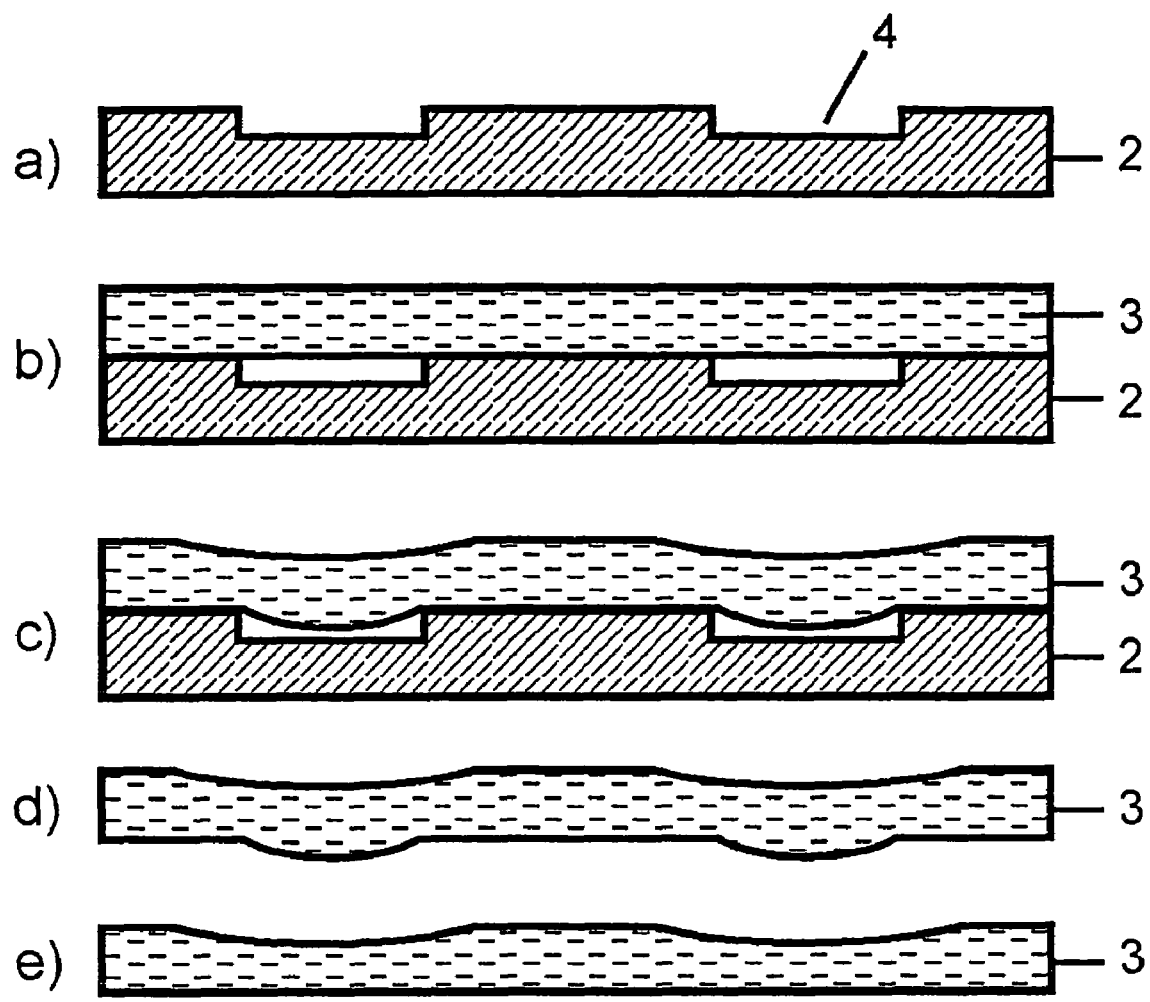
Figure 4:
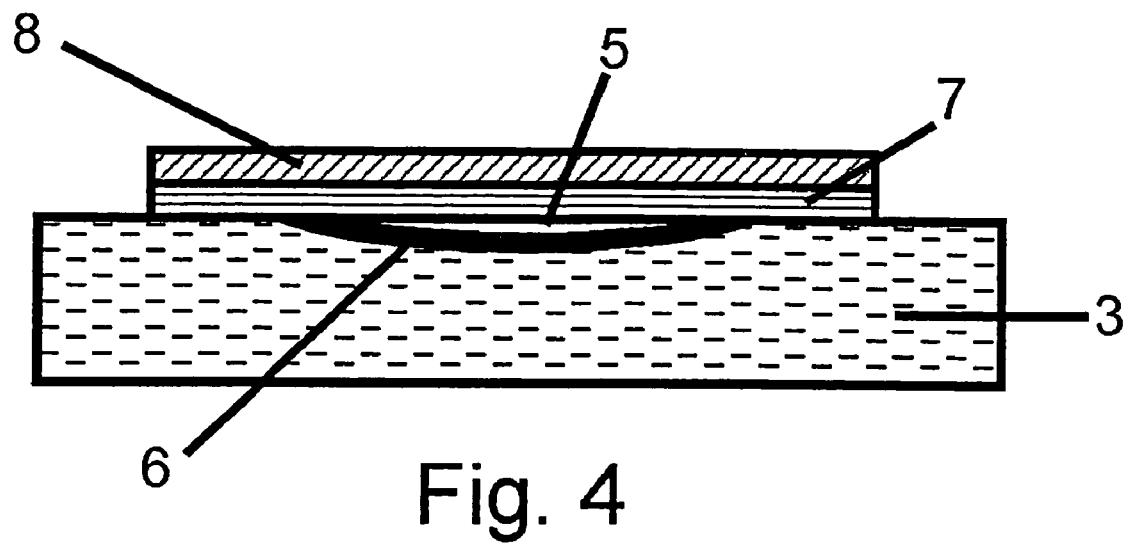
Figure 5:
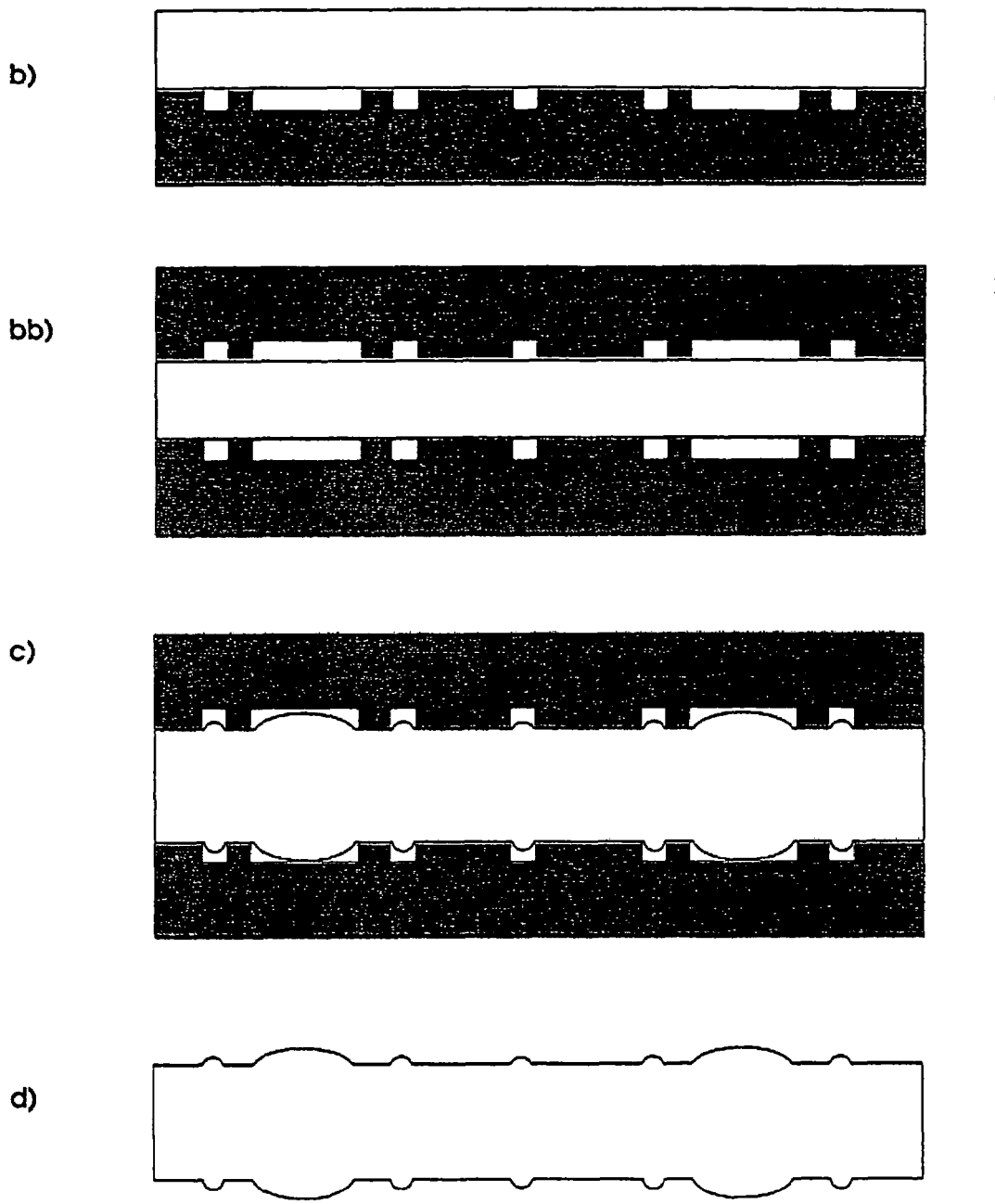
Figure 6:
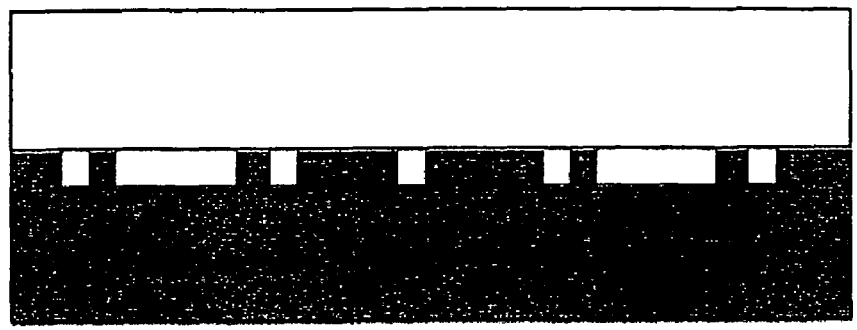
Figure 6:
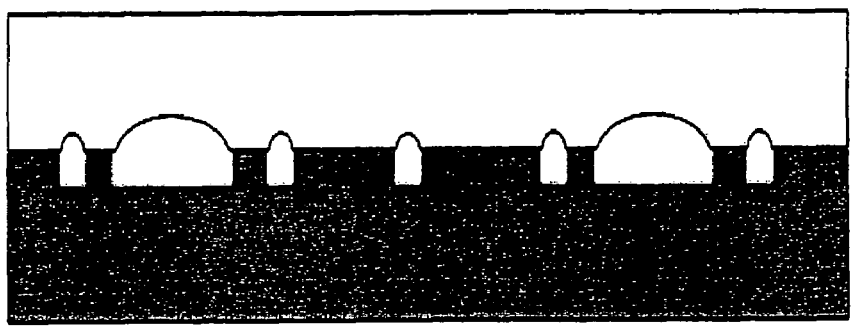
Figure 6:
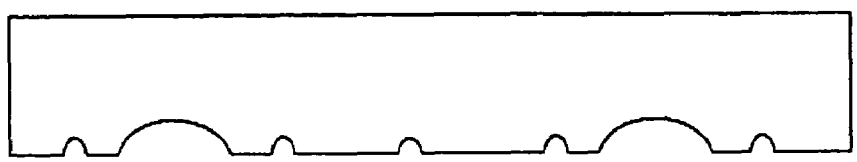

The present invention will be described in the following in details by embodiments, without restriction of the inventive idea, with reference to the drawing wherein:

FIG. 1 illustrates a schematic process flow for relief moulding of a structured surface processed in a semiconductor substrate on a glass-type material, FIG. 2 shows a schematic process variant wherein a lens system, for example, is produced by partial inflow of the glass material into recesses prepared on a semiconductor substrate, FIG. 3 represents a process variant for the production of a micro-mechanical component, FIG. 4 shows an example of a micro-mechanical electrostatic actuator produced in accordance with the inventive method, FIG. 5 illustrates a process variant for the production of a glass substrate with a micro structure on both sides, and FIG. 6 shows a process variant for the manufacture of micro dispersing lenses.

DESCRIPTION OF WAYS OF REALISING EMBODIMENTS

FIG. 1 illustrates various stages of a process for the manufacture of a micro-structure glass surface with application of the inventive method for projecting a structured silicon surface. These are manufacturing stages following the completion of the following operating steps:

(a) formation of a structure in the photo resist (1),
(b) transfer of the structure by etching the photo resist and the surface of the silicon wafer (2),
(c) anodic bonding of a Pyrex® glass wafer (3) onto the silicon surface structure with recesses (4), preferably under conditions resembling a vacuum,
(d) annealing and inflow of the glass into the silicon surface structures under the action of overpressure and/or required by the difference in pressure between the furnace atmosphere and the pressure situation created in the anodic bonding process and preserved in the silicon surface recesses,
(e) grinding and polishing the glass surface turned away from the silicon, after cooling and subsequent removal of the silicon by etching, e.g. in tetra methyl ammonium hydroxide.

For the prevention of the formation of roughness on the rear side of the glass wafer, which occurs in the inflow process, from the very beginning, an alternative envisages the application of a second planar silicon wafer on the rear side of the glass wafer by a second anodic bonding process after the glass wafer has been bonded to the structured silicon wafer.

As silicon has a thermal stability and the rear side of the glass wafer is chemically bonded to the rear-side silicon wafer during the anodic bonding process, this combination produces a homogenising effect on the rear side in the subsequent flow process. The rear side hence remains planar. When the front-side silicon wafer is removed it is possible at the same time to remove the rear-side silicon wafer.

FIG. 2 illustrates two different stages in the manufacture of a micro-structured glass surface with application of a variant of the inventive method for the production of a micro-lens array in glass. These are manufacturing stages joining the following steps of process:

(a) structuring the surface of the silicon wafer (2) with recesses,
(b) anodic bonding of a Pyrex® glass wafer (3) on the silicon surface structures with recesses (4), preferably under conditions resembling those of vacuum,
(c) annealing and partial inflow of the glass into the silicon surface structures without contacting the bottom of the recesses in the silicon material,
(d) removal of the silicon wafer, preferably by etching, and
(e) grinding and/or polishing the glass wafer surface turned away from the silicon material.

The process steps (d) and (e) may also be applied in a reverse order.

FIG. 3 illustrates various stages in the production of a micro-structured glass surface with application of a further variant of the inventive method, which is preferably employed for the manufacture of micro-mechanical components. These are manufacturing stages joining the completion of the following steps of method:

(a) structuring the surface of the silicon wafer (2) with recesses,
(b) anodic bonding of an appropriate glass such as Pyrex® glass wafer (3) on the silicon surface structures with recesses (4), preferably under conditions resembling those of vacuum,
(c) annealing and partial inflow of the glass into the silicon surface structures without contacting the bottom of the recesses in the silicon material,
(d) removal of the silicon wafer, preferably by etching, and
(e) grinding and/or polishing the glass wafer surface that had been bonded to the silicon wafer.

The process steps (d) and (e) may also be applied in a reverse order or omitted entirely.

For maintaining the concave dents forming on the upper side of the glass wafer (3) during the annealing process, which upper side is turned away from the SI wafer (2) and which dents are provided to serve technological applications of interest, as will be set out in the following, the structured surface of the Si wafer (2) should have dents of the structure widths B and the glass wafer (3) should have a thickness D, which satisfy the following relationship:

$$B \geq 0.1 \cdot D$$

In this manner it will be ensured that the material flow into the recesses will actually produce the desired effects on the opposite side of the glass wafer (3) and results in the concave dents.

FIG. 4 is a cross-sectional view of a micro-mechanical electrostatic actuator e.g. of the type used as micro-valve or micro-relay, which is manufactured in correspondence with the inventive method. To this end, the flow of process steps is carried out, which is illustrated in FIG. 3. The electrostatic actuator consists of a glass substrate (3) with a recess (4) produced according to the invention. Curved metal electrodes (6) are preferably deposited as a layer in the recesses by means of a standard process in semiconductor technology. Then, an electrically conductive resilient membrane (actuator) is stretched over the recesses containing the electrodes. This may be done by anodic bonding of a silicon wafer or an SOI (silicon-on-isolator) wafer on the glass substrate and by subsequent thinning of the wafer to a thickness of a few micrometers. The membrane then consists of a silicon layer (8) isolated from the electrodes by means of an insulating layer (7). When a voltage is applied between the silicon layer ands the electrodes the membrane is drawn towards the electrode while the micro-valve/micro-relay is commuted.

FIG. 5 shows the steps of the process for the production of a glass substrate structured on both sides. A glass wafer (3) is applied on the structured Si wafer (2) in step (b). A further structured Si wafer (2) is then applied onto the glass wafer (3) in step (bb). Like in the previously described processes, an intimate bond is created between the Si wafer (2) and the glass wafers (3), preferably by means of anodic bonding. When measures are taken to ensure that a negative pressure prevails in the interstices the glass material of the glass wafer (3) will flow into the recesses in the Si wafer on both sides during the annealing process (c). After the appropriate removal of the Si wafer layers (2), e.g. by etching, from the glass wafer (3) the desired component with microstructures on both sides is obtained, which is available for further processing steps.

FIG. 6 illustrates the manufacture of a glass substrate (3) provided with dents. In step (b), a glass wafer (3) is here applied on the structured Si wafer (2w). Like in the aforedescribed processes, an intimate bond is created between the Si wafer (2) and the glass wafers (3), preferably by means of anodic bonding. What is particularly important in the case of FIG. 6 is the aspect that prior to the intimate bonding of the wafers a medium—preferably a gaseous medium—is introduced into the enclosed interstices, which expands when heated. In this manner, a gas is enclosed with a partial pressure—e.g. air or nitrogen—during the step of anodic bonding of the two wafers. When the partial pressure insides the interstices exceeds the surrounding atmospheric pressure during the subsequent flow process at elevated temperatures the glass surface will not sink into the wafer surfaces exposed by etching but is rather actually pushed away from this surface. This produces impressions in the glass wafer. The depth of these impressions depends on the original bonding pressure, the atmospheric pressure, the process temperature as well as the glass temperature $T_G$ of the glass wafer. The structures so created may be used, for example, as dispersing lenses.

Consequently, even a combination of the process explained in FIGS. 5 and 6 is conceivable. It is hence possible to manufacture lenses presenting concave and convex surfaces.

List of Reference Numerals 1 photo resist
2 silicon wafer, generally the first substrate
3 glass substrate
4 surface structure of the first substrate, with recesses
5 recess
6 curved metal electrodes
7 insulating layer
8 silicon layer

The invention claimed is:

1. A method of structuring surfaces of micro-mechanical and/or micro-optical components and/or functional elements consisting of glass-type materials, comprising:
providing a first substrate, structuring at least one surface of said first substrate in order to obtain recesses on the surface,
providing a second substrate of glass-type material,
joining said first substrate to said second substrate, with the structured surface of said first substrate being joined to a surface of said second substrate in an at least partly overlapping relationship and with a gaseous medium being introduced into said recesses, said gaseous medium expands when heated,
annealing said first and second substrates so bonded in such a way that due to the expansion of said gaseous medium within said recesses in said first substrate a local displacement of said glass-type material takes place, so that the side of said second substrate will be structured, which faces said first substrate, and
separating said second substrate from said first substrate.

2. The method according to claim 1, wherein the separation of said second substrate from said first substrate comprises removal of said first substrate by etching.

3. The method according to claim 1, wherein the separation of said second substrate from said first substrate comprises providing a parting layer between said first and second substrates, that is applied on said structured surface while maintaining the structure prior to joining said first and second substrates and is configured as a sacrificial layer that will be destroyed by thermal and/or chemical action and permits a separation of said first and second substrates from each other.

4. The method according to claim 3, wherein a metal layer is employed as the parting layer, the metal layer having a melting point below the melting points of said first and second substrates.

5. The method according to claim 3, wherein an oxidizable layer is used as the parting layer, the oxidizable layer undergoes a chemical reaction when oxygen and/or thermal energy is supplied.

6. The method according to claim 3, wherein a carbon layer, a diamond layer, a diamond-type layer or SiC is used as the parting layer.

7. The method according to claim 6, wherein the structured surface of said first substrate includes recesses having structure widths B and said second substrate has a thickness D, and the following approximate relationship applies:

$$B > 0.1\ D.$$

8. The method according to claim 1, wherein said first substrate is a semiconductor substrate and/or said glass-type material is a borosilicate glass.

9. The method according to claim 7, wherein said semiconductor substrate is a silicon substrate and/or said borosilicate glass is Pyrex® glass.

10. The method according to claim 1, wherein the step of joining said first substrate to said second substrate is carried out by anodic bonding.

11. The method according to claim 10, wherein an overpressure acts upon the surface of said second substrate, which is turned away from said first substrate, throughout the annealing process, the amount of overpressure is less than an amount of pressure inside said recesses.

12. The method according to claim 1, wherein one surface of said second substrate is planished by grinding and/or polishing after annealing or after removal of said first substrate by etching.

13. The method according to claim 1, wherein a third substrate is evenly applied on a side of said second substrate, which is turned away from said first substrate, prior to the annealing process.

14. The method according to claim 13, wherein said third substrate is a semiconductor substrate.

15. The method according to claim 13, wherein said third substrate is removed by an etching operation after the annealing process and a planar surface is created on the side of said second substrate which is turned away from said first substrate.

16. The method according to claim 1, wherein the annealing process is stopped when a desired pressure inside said recesses and acting upon the surface of the second substrate, which is turned away from said first substrate, is reached.

17. The method according to claim 16, wherein the annealing process is stopped by cooling of said first and second substrates when the desired shape of the second substrate is reached.

* * * * *